(12) United States Patent
Teeuwen

(10) Patent No.: US 6,870,603 B2
(45) Date of Patent: Mar. 22, 2005

(54) LITHOGRAPHIC APPARATUS AND METHOD TO DETERMINE BEAM CHARACTERISTICS

(75) Inventor: Leonardus Johannes Hendrikus Gerardus Wilhelmus Teeuwen, Reuver (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/701,063

(22) Filed: Nov. 5, 2003

(65) Prior Publication Data

US 2004/0114122 A1 Jun. 17, 2004

(30) Foreign Application Priority Data

Nov. 13, 2002 (EP) .............................. 02079722

(51) Int. Cl.⁷ .............................................. G03B 27/42
(52) U.S. Cl. .............................. 355/68; 355/71; 355/77
(58) Field of Search ............................. 355/68, 71, 77, 355/56

(56) References Cited

U.S. PATENT DOCUMENTS

| | | | |
|---|---|---|---|
| 4,916,319 A | 4/1990 | Telfair et al. | 250/461.1 |
| 5,121,160 A | 6/1992 | Sano et al. | 355/53 |
| 5,296,891 A * | 3/1994 | Vogt et al. | 355/67 |
| 5,909,274 A | 6/1999 | Stucchi | 356/121 |

FOREIGN PATENT DOCUMENTS

DE    4416988 A1    11/1995

OTHER PUBLICATIONS

European Search Report of EP 02079722.1 dated Aug. 20, 2003.

* cited by examiner

Primary Examiner—Kiet T. Nguyen
(74) Attorney, Agent, or Firm—Pillsbury Winthrop LLP

(57) ABSTRACT

A lithographic apparatus is provided that has an aperture, a detector configured to detect an intensity of a radiation beam directed through the aperture and a processor configured to vary the intensity of the radiation beam through the aperture by a relative movement of the radiation beam and the aperture and to calculate a beam size of the radiation beam from the detected intensity and relative movement. Alternatively or in addition, a lithographic apparatus may include a focusing element configured to focus a part of a radiation beam in a focus plane, an aperture arranged in the focus plane of the focusing element, a detector configured to detect an intensity of the part of the radiation beam through the aperture, and a processor configured to vary the intensity of the radiation beam through the aperture by a change in a pointing direction of the radiation beam and to calculate a beam divergence of the radiation beam from the detected intensity and pointing direction. The apparatus offers a means to determine beam quality characteristics such as beam size and/or beam divergence.

31 Claims, 5 Drawing Sheets

Relative intensity

Tilt angle of pointing mirror in X-direction

Relative intensity

Tilt angle of pointing mirror in Y-direction

LITHOGRAPHIC APPARATUS AND METHOD TO DETERMINE BEAM CHARACTERISTICS

This application claims priority from European patent application EP 02079722.1 filed Nov. 13, 2002, herein incorporated in its entirety by reference.

FIELD

The present invention relates to apparatus and methods to determine beam characteristics.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus, each target portion is irradiated by exposing the entire mask pattern onto the target portion at one time; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling an incoming radiation beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, both incorporated herein by reference.

Developments in the field of lithography for improving projection image quality have demonstrated the necessity of improving several characteristics of the radiation beam as provided in a lithographic apparatus. Generally, these characteristics comprise the homogeneity or uniformity of the beam, the size and/or shape of the beam, the pointing direction of the beam, and the divergence of the beam, further indicated as "beam quality characteristics". Until now, only limited options are available in a lithographic system to determine such beam quality characteristics and to control such characteristics. Specifically, when a radiation beam lacks a proper dimensioning and homogeneity, the ellipticity, for example, of the projection beam can be affected, causing a different imaging quality of horizontal and vertical structures on a substrate.

A lithographic system typically uses a radiation source, such as for example a laser, which provides a radiation beam that is further lead into an illumination system and subsequently towards a patterning device, such as a mask. Such a radiation source is a unit which is generally positioned at a certain distance from the rest of the lithographic apparatus, which typically comprises the illumination system, the patterning device support structure, the projection system, and the substrate table.

The illumination system is used to guide the beam towards a support structure for supporting a patterning device and to control the illumination thereof. Hence, in a conventional lithographic system, the beam travels from the radiation source to the illumination system, and, before entering the illumination system, simple conditioning of the beam is possible, such as manually adjusting an optical conditioning unit such as a beam expander in order to modify the size of the beam in two different directions or directing the beam by one or more steering mirrors.

In order to determine the beam size of a radiation beam traveling through the illumination system, conventionally, a fluorescent raster target is placed in the optical path of the beam and the dimensions of the beam are visually interpreted or graphically recorded by, for example, a CCD camera. An example of such a camera arrangement is given in U.S. Pat. No. 4,916,319. The image from the camera may then be analyzed further. Based on the value of the beam size thus determined, the optical conditioning unit can be manually adjusted. This process is repeated until a proper beam size is achieved, so that the beam is tuned—until a new adjustment of the lithographic system appears necessary.

In order to determine the beam divergence, conventionally, the fluorescent raster target is placed in at least two positions along the optical path of the beam, the difference in beam size between the two positions being indicative of the divergence of the beam. Although considered relevant for achieving optimal illumination conditions, no quick or automated procedure exists in order to measure a beam divergence of the beam, which although small, may be able to influence the system in quite a severe manner, since in a lithographic system the imaging pupil will be distorted depending on such beam quality characteristics.

It is clear that the above procedures for determining beam size and divergence are tedious and time-consuming, let alone the costs involved of keeping the apparatus in a non-productive state during such procedures.

In a number of lithographic apparatus, a detector for detecting the intensity of the radiation beam in the illumination system is present. Such a detector is for example an energy sensor (ES), which captures a split version of the beam and measures an energy influx, in order to provide a control of the radiation dose delivered to a target portion of the substrate. Another example of such a detector is a positional detector used in a so called beam measuring unit (BMU), which is able to determine the position and pointing direction of the radiation beam in the illumination system. The BMU comprises focusing elements that image split versions of the beam on two position sensitive devices (PSDs), the position on the first PSD being indicative of the entering position of the beam and the position on the second PSD being indicative of the pointing direction of the beam. A PSD can operate as a detector for measuring a radiation intensity when the output signals of the PSD are being summed or integrated.

SUMMARY

Accordingly, it would be advantageous to provide a lithographic apparatus and a method having improved measurement and control of quality characteristics of a radiation beam for illumination of a substrate. It would also be advantageous to provide a lithographic system wherein such quality characteristics can be measured and controlled without drastic modifications of existent lithographic systems. It would also be advantageous to use an energy sensor (ES) or a beam measuring unit (BMU) to determine and control such quality characteristics of the radiation beam such as beam size and beam divergence. Further, it would be advantageous to reduce the amount of additional tool equipment and workload needed to provide such control. It would further be advantageous to provide a method for determining a beam size and divergence of a radiation beam in a lithographic apparatus, improving over known procedures of adjusting and tuning beam characteristics.

According to an aspect of the invention, there is provided a lithographic apparatus comprising:

an illuminator configured to provide a beam of radiation;

a support structure configured to hold a patterning device, the patterning device configured to pattern the beam according to a desired pattern;

a substrate table configured to hold a substrate;

a projection system configured to project the patterned beam onto a target portion of the substrate;

an aperture configured to permit propagation of the beam of radiation therethrough;

a detector configured to detect an intensity of at least part of the beam of radiation propagating through the aperture; and a processor configured to vary the intensity of the radiation beam through the aperture by a relative movement of the radiation beam and the aperture and to calculate a beam size of the radiation beam from the detected intensity and relative movement.

By reducing/increasing a part of the radiation beam that passes through the aperture, the intensity of radiation incident on the detector will be reduced/increased. Hence, by determining the relative displacement of the aperture and the radiation beam while measuring the amount of incident radiation, in a simple way, the size of the beam can be determined. Either the position of the radiation beam or the position of the aperture can be changed. Hence, an improved and actual online control of the radiation beam quality characteristics can be possible by using a lithographic apparatus as described herein. A possible advantage of an embodiment of such a lithographic apparatus is to easily determine a beam characteristic of a radiation beam therein without needing the long interruptions caused by disassembly of the illumination system and placing separate tool equipment therein which is not functional during the actual lithographic process.

In an embodiment, the processor is arranged for receiving a first relative intensity at a first relative position of the radiation beam and for receiving a second relative intensity at a second relative position of the radiation beam; wherein the processor is arranged to calculate the beam size as a ratio of differences of first and second relative positions and first and second relative intensities. In middle positions between a complete shut-off of the radiation beam and a complete pass-through of the radiation beam, a linear relationship exists between the displacement and the measured energy, which holds for rectangular beam cross-sections. From this relationship, the total beam size can easily be determined by extrapolation.

In an embodiment, the device for varying the position of the radiation beam and thereby the intensity passed through the aperture comprises a first tiltable mirror coupled to said processor. In such an arrangement the processor may calculate a relative movement of said reflected radiation beam as a function of a received tilt of said mirror and as a function of a predetermined beam delivery length between said mirror and said aperture. Such a mirror may already be present in the system as a steering mirror, in which case, by very simple adaptation and measurement of the tilt angle, the position of the radiation beam at the location of the aperture may be determined using a known beam delivery length. In this respect, the term "beam delivery length" refers to an optical distance traveled by a radiation beam between, in this case, the mirror and the aperture.

In such a mirror arrangement, the processor may be arranged for receiving a third relative intensity at a third relative position of the radiation beam, wherein the radiation beam at least partially, but preferably 50%, overlaps the aperture on a first side of the aperture and for receiving a fourth relative intensity at a fourth relative position of the radiation beam wherein the radiation beam at least partially, but preferably 50%, overlaps the aperture on a second side of the aperture opposite said first side; wherein the processor is arranged to calculate the beam delivery length as a function of said third and fourth tilt angles and a predetermined distance between said opposite sides of said aperture.

Conveniently, said mirror is tiltable in two different directions, so as to be able to determine the beam size in two cross-directions.

In a conventional illumination system, the radiation beam may be further conditioned by controlling the angular distribution of the beam; this is often performed by a so-called diffractive optical element (DOE). Although for applying the method described herein, any aperture placed in the optical path of the radiation beam may be used for determining a beam size, in an embodiment, the aperture through which the radiation beam is directed, is formed by the non-transmissive frame of such a diffractive optical element. In that case, the size of the aperture is in the order of 50×32 mm.

The lithographic system according to an embodiment of the invention takes advantage of a conventional steering mirror located at a relatively large distance from the aperture, a conventional diffractive optical element serving as the aperture and a conventional energy sensor ES, which typically is already present in a conventional lithographic system, for detecting the amount of energy that is transferred to the substrate. In this respect, no substantive modification of an illumination system of a lithographic apparatus is necessary to perform a beam size determination.

In an embodiment, the apparatus further comprises an optical element for varying the beam size of said radiation beam, said optical element coupled to said processor, so as to tune said radiation beam to a desired beam size. In this way, a direct feedback loop can be formed to control the beam size and inaccurate manual tuning and adjustment of the optical element for varying the beam size can be avoided.

In an embodiment, a focusing element having a predetermined focusing power may be arranged to focus said radiation beam or part of said beam in a focus plane, said aperture being arranged in said focus plane of said focusing element, followed by a detector such as a positional detector. The processor may be arranged to determine the size of said focused radiation beam, for example, by moving the aperture relative to the focused beam; and the processor is further arranged to calculate a beam divergence of said radiation beam as a function of said size of said focused radiation beam. Where such a focusing element may already be present in a lithographic apparatus, an elegant possibility to measure the beam divergence is offered by slight modifications of detection and control systems. Therefore, in addition to the earlier described apparatus for measuring a beam size, in an embodiment, beam divergence measurements are also possible by using the fact that a parallel beam produces a point-like spot when focused whereas a diverging beam produces a spot of non-zero size when focused. The amount of divergence is thus reflected in the size of the spot; hence, using a focusing element, such as a focusing lens or mirror, a determination of the divergence is possible. An alternative for determining the size of the focused radiation beam and thereby the divergence of the beam is to change the pointing direction of the beam, for example by tilting a second mirror located relatively close to the aperture, and determining a first pointing direction in which a relatively low intensity passes through the aperture (for example 10%) and a second pointing direction in which a relatively high intensity passes through the aperture (for example 90%). The beam divergence is then directly calculated from the difference between these first and second pointing directions and the relative intensities detected at these pointing directions.

In an optical path of said radiation beam, said first mirror may be provided relatively far from an aperture followed by a second mirror which is located relatively close to an aperture, in such a way, that said first mirror changes substantially a relative position of said radiation beam and said second mirror changes substantially a pointing direction of said radiation beam. In this arrangement, both beam size and divergence can be determined.

According to a further aspect of the invention, there is provided a method of determining a beam size of a radiation beam in a lithographic apparatus, comprising:

changing a position of the radiation beam relative to an aperture through which the radiation beam propagates;

detecting the intensity of at least part of the radiation beam propagating through the aperture relative to a maximum intensity as a function of relative movement of the radiation beam; and calculating the beam size of the radiation beam from the detected intensity as a function of the relative movement.

In an embodiment, the method may comprise detecting a first relative intensity at a first relative position of the radiation beam; detecting a second relative intensity at a second relative position of the radiation beam; and calculating the beam size as a ratio of differences of first and second relative positions and first and second relative intensities. In an embodiment, said first and second relative positions correspond to 10% and 90% relative intensity of the radiation beam.

The method may further comprise providing a first tiltable mirror; reflecting said radiation beam by said mirror; measuring a relative movement of said reflected radiation beam as a function of tilt angle of said mirror and as a function of a predetermined beam delivery length between said mirror and said aperture.

In an embodiment, the method may comprise detecting a third relative intensity at a third relative position of the radiation beam corresponding to a third relative tilt angle of the mirror, wherein the radiation beam at least partially overlaps the aperture on a first side; detecting a fourth relative intensity at a fourth relative position of the radiation beam corresponding to a fourth relative tilt angle of the mirror, wherein the radiation beam at least partially overlaps the aperture on a second side opposite said first side; and calculating the beam delivery length as a function of said third and fourth tilt angles and a predetermined distance between said opposite sides of said aperture. Said third and fourth relative positions may correspond to 50% relative intensity of the radiation beam. Said beam size may be measured in two different directions, more particularly, the radiation beam may be moved relative to the aperture in two different directions.

In an embodiment, the method may comprise providing a beam of radiation; providing a focusing element; focusing said radiation beam in a focus plane by said focusing element; and determining the size of the spot of radiation in said focus plane as a measure of the beam divergence. In an embodiment, said measurement is performed by a spot size measurement similar to the above described beam size measurement; however the invention is not limited thereto as other measurement methods for determining the beam divergence of said radiation beam may be applied.

In an embodiment, the (absolute) divergence of said radiation beam may be calculated from the measured intensity as a function of pointing direction.

The focused radiation beam may be incident on a positional detector, such as a position sensitive device (PSD), arranged in or adjacent to the focus plane of said focusing element. A relative incident position of said focused radiation beam on said positional detector is normally indicative of the average direction of the radiation beam. The positional detector may comprise a fixed aperture, the size of the aperture possibly being in the order of 9×9 mm.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
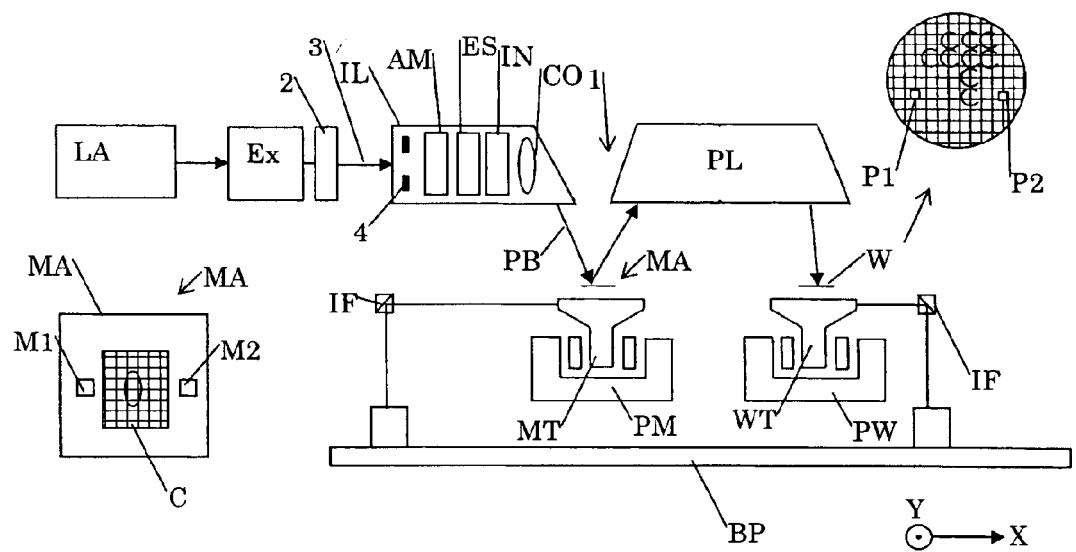
FIG. 1 depicts a lithographic apparatus according to an embodiment of the invention.

FIG. 1 schematically depicts a lithographic apparatus 1 according to a particular embodiment of the invention. The apparatus comprises:

a radiation system LA, Ex, 2, IL, for supplying a projection beam PB of radiation (e.g. radiation in the deep ultraviolet region);

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a silicon wafer), and connected to second positioning means PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a reflective type (e.g., has a reflective mask). However, in general, it may also be of a transmissive type (e.g., with a transmissive mask).

Alternatively, the apparatus may employ another kind of patterning device, such as a programmable mirror array of a type as referred to above.

The radiation source LA (e.g. an excimer laser source) produces a beam of radiation. This beam is fed into an illumination system (illuminator) IL, either directly or after having traversed optical conditioning means, such as a beam expander Ex, or one or more directing mirrors 2. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic apparatus (as is often the case when the source LA is a mercury lamp, for example), but that it may also be remote from the lithographic apparatus, the radiation beam which it produces being led into the apparatus (e.g. with the aid of suitable directing optics 2); this latter scenario is often the case when the source LA is an excimer laser. The current invention and claims encompass both of these scenarios. The directing optics and the optical conditioning system Ex such as a beam expander need not be physically separated systems but they can also be intermixed, for example the beam expander comprising one of the directing optics.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed $V=Mv$, in which M is the magnification of the lens PL (typically, $M=¼$ or $⅕$). In this manner, a relatively large target portion C can be exposed, without having to compromise on resolution.

In the lithographic apparatus 1, a radiation beam 3 is guided through an aperture 4 which is present in the illumination system IL. Directing optics 2 for directing the radiation beam 3 through said aperture 4 are also provided along with a detector ES (for example, an energy detector) for detecting an intensity of the radiation beam through said aperture. To determine beam size, a raster target has been used which is, for this purpose, placed manually in the illumination system IL. This procedure is time-consuming, incorporates a safety risk as UV radiation is employed, and may contaminate the illumination system. Furthermore, the image acquired by the raster target is not easily readable.

Figure 2:
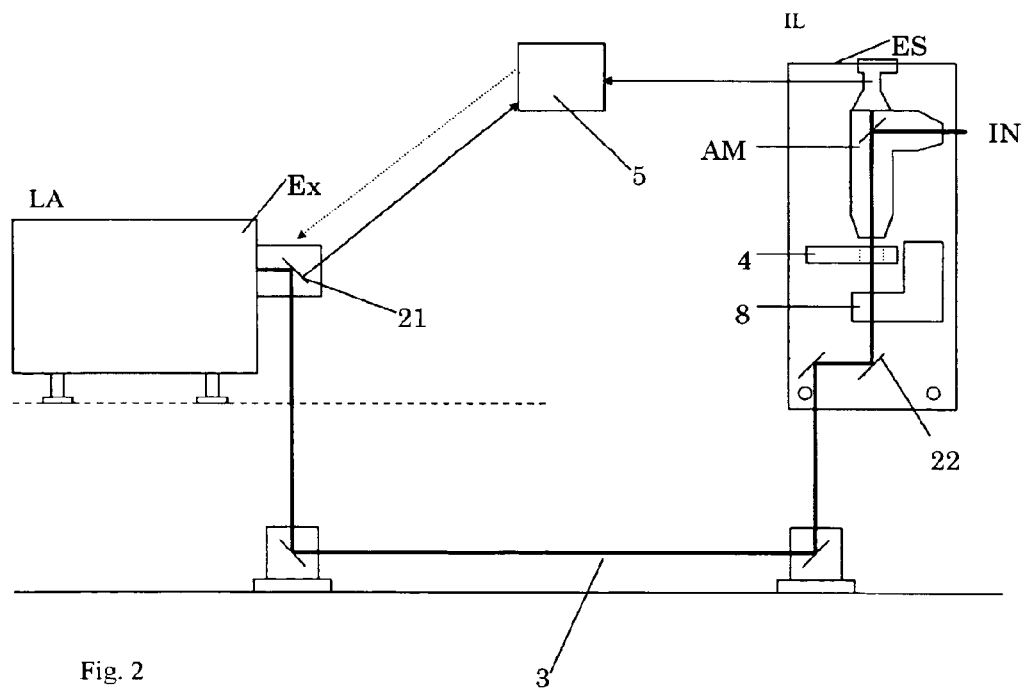
FIG. 2 schematically depicts the LA-Ex-2-IL elements of FIG. 1.

In FIG. 2, a more detailed illustration is shown of the LA-Ex-2-IL elements of FIG. 1. In the figure, the radiation source LA is a deep ultraviolet (DUV) excimer laser, although other types of radiation sources could be employed. The radiation beam emanating from the laser is conditioned by an optical conditioning unit EX, which is a unit for adjusting the beam size in the X- and Y-direction. Conventionally, this unit comprises a manually adjustable lens system that is movable along an optical axis, the position of the lenses determining the size in the X- and/or Y-direction. In the optical conditioning unit Ex, a tiltable steering mirror 21 is present, a tilt of which causes, depending on the axis of rotation, a lateral displacement in X- or Y-direction of the beam near the aperture 4. In this way, the beam 3 can be directed through the aperture 4, which, in this embodiment, is formed by the edges of the frame of a diffractive optical element (DOE) in an automated DOE-exchanger. From such an exchanger, a DOE is selected for further conditioning the beam in a desired way. The conditioning generally comprises controlling the angular distribution of the beam.

In the illumination system IL, a fraction of the radiation beam is guided into a beam measuring unit 8, which is present for measuring the position and pointing direction of the radiation beam and will further be explained with reference to FIG. 5. The majority of the beam travels through the DOE and the aperture 4 and is guided into a zoom axicon AM, which is there for setting the outer and/or inner radial extent (commonly referred to as σ-outer and σ-inner, respectively) of the intensity distribution in the beam. A fraction of the energy of that radiation beam is guided into detector ES, the rest is directed to further elements of the illumination unit, such as the integrator IN and condensor CO.

The output signal of the detector is related to the amount of energy that is incident on the substrate held by the substrate stage, which amount is relevant for the photosensitive materials applied in photolithography. In this embodiment, the size of beam 3 is measured by a processor 5 coupled to the steering mirror 21, the processor measuring a tilt angle in relation to a measured energy signal from detector ES.

Figure 3:
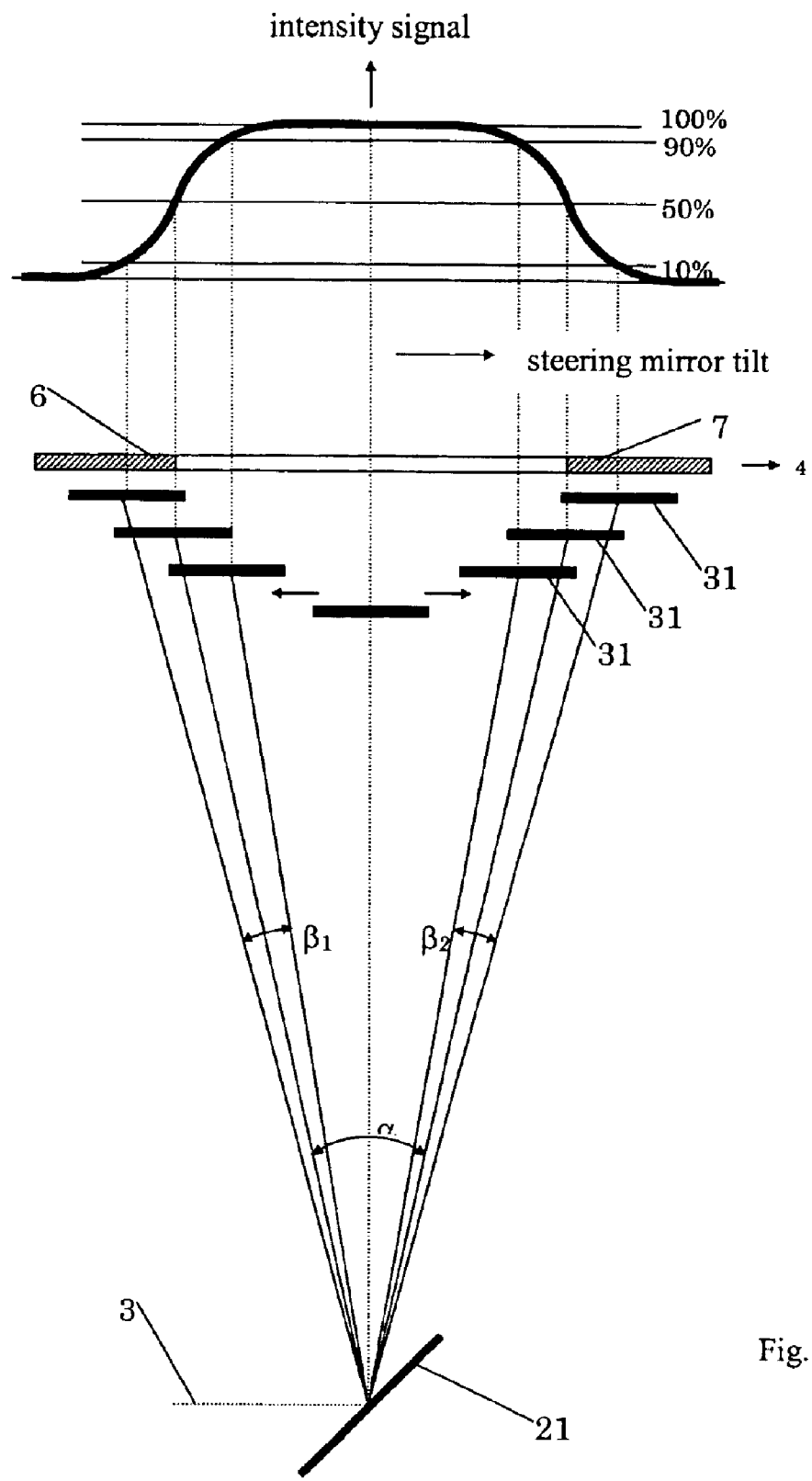
FIG. 3 schematically illustrates a diagram of an ES signal in relation to a tilt angle of a steering mirror with corresponding relative positions of the radiation beam and the aperture depicted below said diagram.

Referring to FIG. 3, a relation is shown between a tilt angle of steering mirror 21 and the energy signal that is measured by the detector ES. In order to vary the intensity of said radiation beam through said aperture by a relative movement of the radiation beam and said aperture, the processor is coupled to the steering mirror 21 and is further coupled to the detector ES for measuring said intensity. The processor 5 in FIG. 2 is arranged to calculate the beam size from the obtained energy values as a function of angular displacement.

Referring to FIG. 3, starting from a tilt directing the beam to the far left side of the positionally fixed aperture 4, the beam is blocked by edge 6 of the aperture 4. Then, by rotating the steering mirror 21 clockwise, the beam intensity through the aperture 4 is increased according to the functional relationship depicted in the upper diagram of the figure. By continuing the rotation, eventually, the beam 3 is blocked partially and eventually completely by the opposite edge 7 of aperture 4.

To determine the beam size 31, first, the beam delivery length is determined from the 50% points in the energy diagram, which is equivalent to a tilt angle α as indicated in FIG. 3:

$$\text{beam delivery length} = \frac{\text{aperture size}}{2 \cdot \tan(\frac{\alpha}{2})} \quad [1]$$

Then, the difference in angle between two rotational positions of the steering mirror 21 is measured, wherein in a first position the measured intensity is relatively low, for example 10% of the maximum intensity, and in a second position the measured intensity is relatively high, for example 90% of the maximum intensity. These two angular positions at a first side of the aperture define $\beta_1$, and these two angular positions at a second opposite side define $\beta_2$. The average of $\beta_1$ and $\beta_2$ is defined as $\beta$, which is subsequently used to calculate the beam size according to the following formula:

$$\text{beam size} = C \cdot \tan(\beta) \cdot \text{beam delivery length} \quad [2]$$

wherein the constant C depends on the specific relative intensities at the first and second positions. In this particular case, only 80% of the beam size (i.e. the 10%–90% points) is actually measured, hence C equals 1.25, assuming a substantially linear relationship between energy intensity and angular displacement which is true for rectangular beam cross-sections. The processor is arranged to calculate the beam size as a ratio of differences of first and second relative positions and first and second relative intensities.

Figure 4:
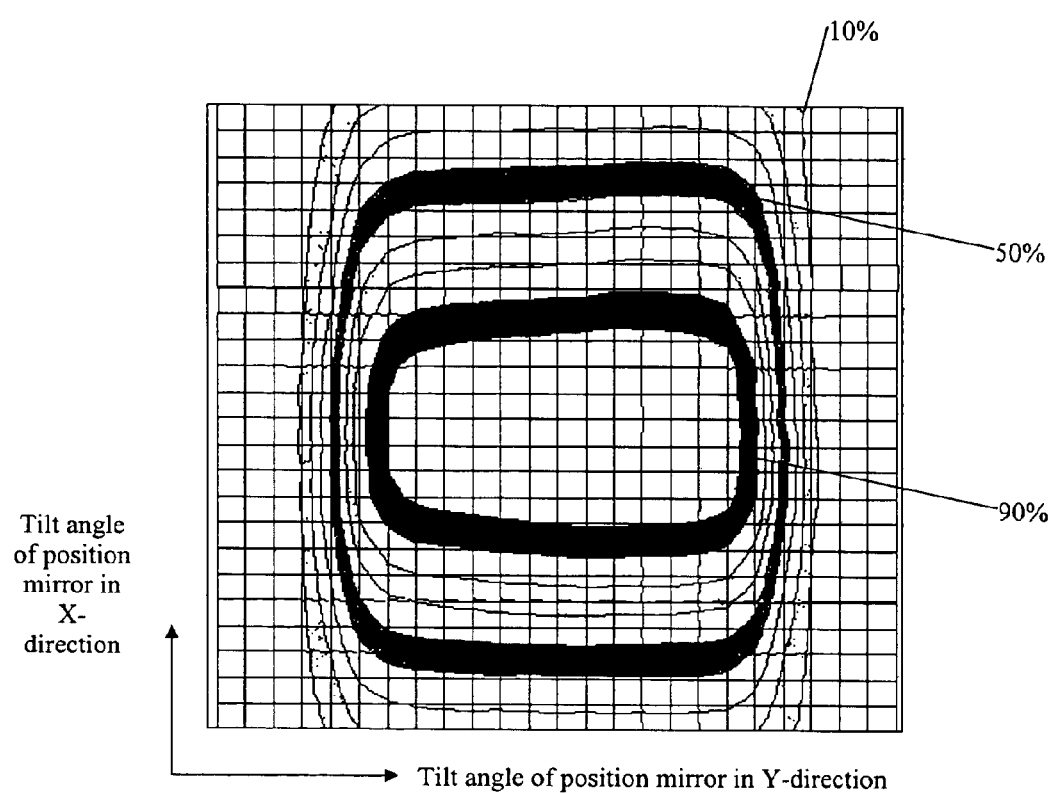
FIG. 4 depicts an energy signal measured in two dimensions for relative tilts in an X- and Y-direction.

In FIG. 4, a two-dimensional plot is shown of actual measurement results in a lithographic system, wherein for a matrix of 25×25 tilt angles the energy intensity was measured. From this two-dimensional plot, the size of the beam can be calculated along a cross-section, where the 10, 50 and 90% points are determined by linear interpolation. It is apparent that the size of the radiation beam is larger in the X-direction than in the Y-direction since 10% and 90% relative intensity lines are spaced closer in the Y-direction.

The results of a typical beam size determination are given in the following Table 1:

TABLE 1

| Parameter | Tilt angle upper side [mrad] | Tilt angle lower side [mrad] |
|---|---|---|
| 10% | −3.83 | 5.44 |
| 50% | −1.02 | 7.99 |
| 90% | 1.45 | 10.55 |
| A |  | 9.01 mrad |
| B | 5.28 mrad | 5.11 mrad |
| aperture size | 50 mm | 50 mm |
| beam size in X | 36.6 mm | 35.5 mm |

Figure 5:
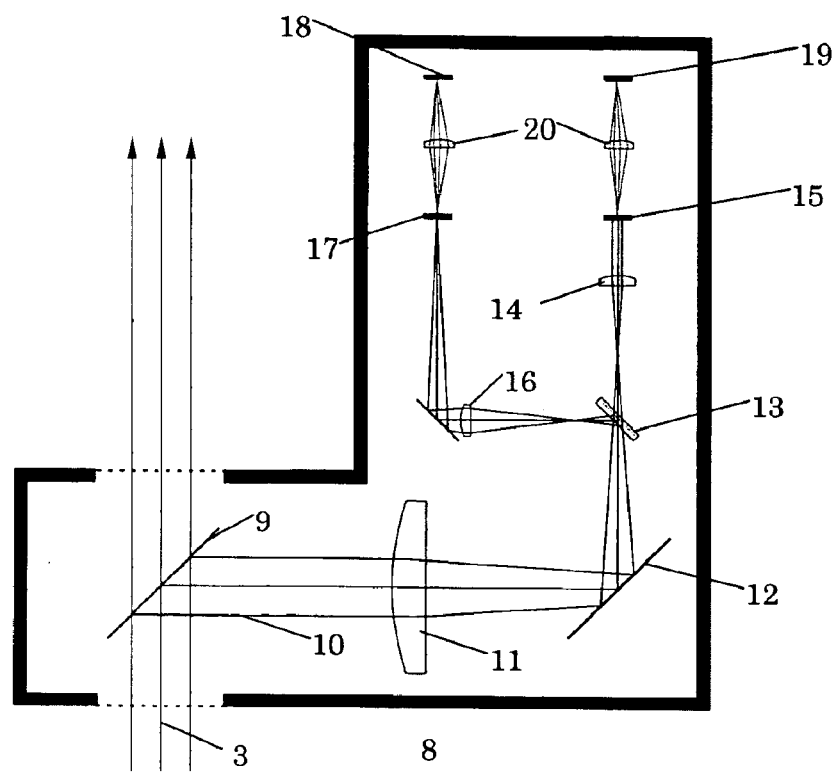
FIG. 5 depicts a more detailed illustration of the beam measuring unit illustrated in FIG. 2.

In FIG. 5, a detailed illustration is provided of a beam measuring unit BMU 8. About 1% of the radiation beam 3 (DUV laser beam) that propagates in the direction of the zoom-axicon AM is split off by the incoupling mirror 9. The split beam 10 travels through a lens 11 and via a reflective mirror 12 to a second semi-reflective mirror 13, which splits the split beam 10 into two halves. The part that passes mirror 13 is imaged by lens 14 on a fluorescent target 15 (in this example: YAG:Ce). The other part of the beam that is reflected by mirror 13 is focused by lens 16 on a second fluorescent target 17. The construction of both optical paths is such that the combination of lenses 11 and 14 make an image of the split beam on the fluorescent target 15, while the combination of lenses 11 and 16 focuses the split beam on the fluorescent target 17. Consequently lens combination 11 and 14 is used for measuring the position of the beam, while lens combination 11 and 16 is used for measuring the pointing direction of the beam. The part radiation beams are absorbed in the fluorescent targets (YAG:Ce crystal). The targets emit visible light that is imaged 1:1 on respective position sensitive devices (PSDs) 18 and 19 by lenses 20.

Figure 6:
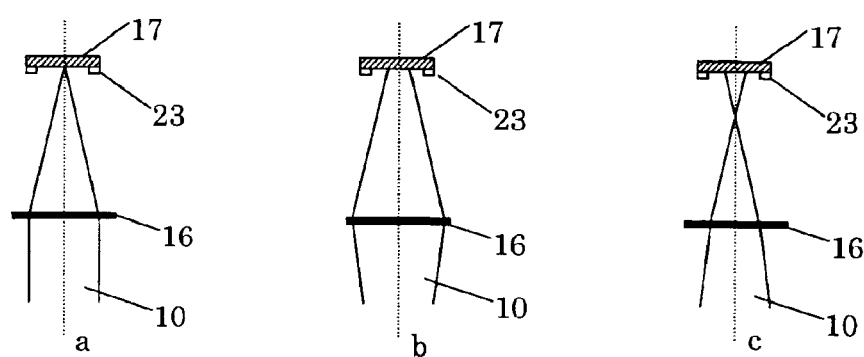
FIG. 6 depicts the focusing of a parallel (a), a diverging (b), and a converging radiation beam (c)

The part radiation beam is focused to a point-like spot on target 17 (see FIG. 6a) in case of a purely parallel beam and if lenses 11 and 16 are properly aligned/positioned. If the beam is diverging or converging, the focused beam results in a spot with non-zero size (see respectively FIGS. 6b and 6c). The size of this spot on target 17 is a measure of the divergence or convergence of the beam and can be measured by scanning the spot with a second beam steering mirror 22 over the diaphragm 23 in front of the target 17 or in front of the position sensing device PSD 18, as explained above. For this divergence determination, the sum signal of the pointing PSD 18 should be used as a measure of the total radiation intensity through the aperture.

Figure 7:
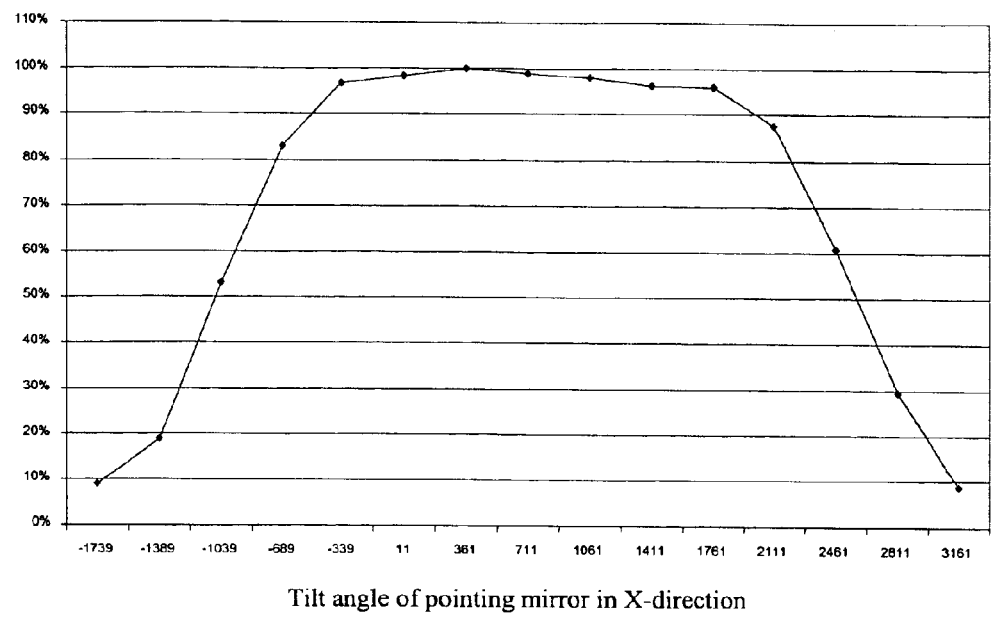
FIG. 7 depicts measurement results for changing the pointing of the beam in the X-direction.
Figure 8:
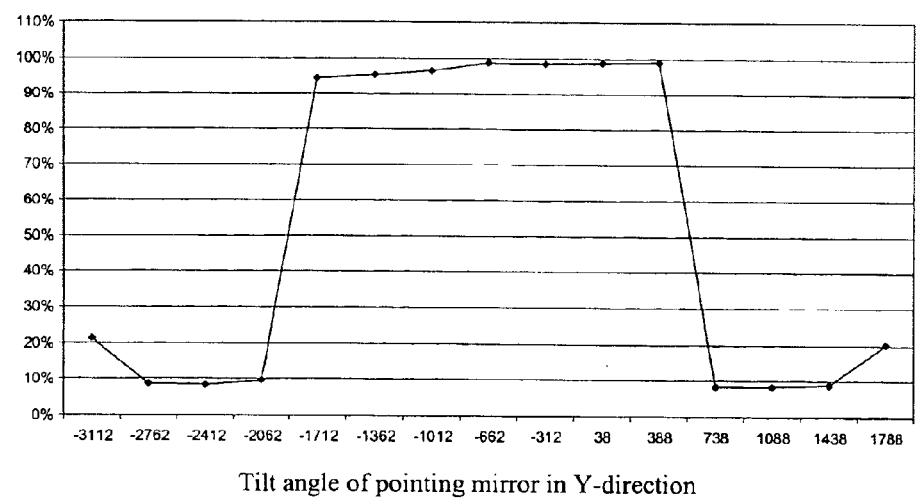
FIG. 8 depicts measurement results for changing the pointing of the beam in the Y-direction.

The results of a beam divergence determination are illustrated in FIGS. 7 and 8. The results of FIG. 7 are listed in Table 2. The tilt angle is converted from steps of a rotational encoder to mrads.

TABLE 2

| Parameter | Tilt angle left side [steps] | Tilt angle left side [mrad] | Tilt angle right side [steps] | Tilt angle right side [mrad] |
|---|---|---|---|---|
| 10% | −1703 | −3.04 | 3140 | 3.59 |
| 50% | −1070 | −1.91 | 2580 | 4.59 |
| 90% | −508 | −0.91 | 2009 | 5.56 |
| α |  |  | 6.50 mrad |  |
| β |  | 2.13 mrad |  | 1.97 mrad |

Angle β is the difference in tilt angle between the two positions of the second steering mirror 22 at 10% and 90% of the maximum sum signal of the pointing PSD 18 and is a direct measure of the beam divergence in the X- and Y-directions. Angle β [mrad] can be derived from the beam steering mirror 22 rotational position [steps] after a standard calibration procedure.

$$\text{beam divergence} = \beta = C \cdot |\text{Tilt angle 10%} - \text{Tilt angle 90%}| \quad [3]$$

where the constant C equals 1.25 when tilt angles are used corresponding to 10% and 90% of the total beam divergence.

Table 3 shows the results of a typical divergence measurement as described herein compared to a conventional divergence measurement using a photographical recording on a predetermined number of positions in the optical path of the radiation beam. It can be seen that the beam divergence measured as described herein compares favorably with a conventional beam divergence measurement.

TABLE 3

| Parameter | Divergence measurement as described herein [mrad] | Conventional divergence measurement [mrad] |
| --- | --- | --- |
| Beam divergence X | 1.25 * 2.15 = 2.69 | 2.9 ± 0.2 |
| Beam divergence Y | 1.25 * 0.21 = 0.26 | 0.14 ± 0.2 |

While in the described embodiments a single scan in one dimension is performed for measuring a beam size, a beam size may be scanned multiple times for obtaining an accurate 2D impression of the beam cross-section. Where applicable herein, the term optical or focusing element may be a composite element or a set of separate objects providing the same effect. While specific embodiments of the invention have been described above, it will be appreciated that the invention may be practiced otherwise than as described. The description is not intended to limit the invention.

What is claimed is:

1. A lithographic apparatus comprising:
   an illuminator configured to provide a beam of radiation;
   a support structure configured to hold a patterning device, the patterning device configured to pattern the beam according to a desired pattern;
   a substrate table configured to hold a substrate;
   a projection system configured to project the patterned beam onto a target portion of the substrate;
   an aperture configured to permit propagation of the beam of radiation therethrough;
   a detector configured to detect an intensity of at least part of the beam of radiation propagating through the aperture; and
   a processor configured to vary the intensity of the radiation beam through the aperture by a relative movement of the radiation beam and the aperture and to calculate a beam size of the radiation beam from the detected intensity and relative movement.

2. A lithographic apparatus according to claim 1, wherein the processor is configured to receive a first relative intensity at a first relative position of the radiation beam and a second relative intensity at a second relative position of the radiation beam and to calculate the beam size as a ratio of differences of first and second relative positions and first and second relative intensities.

3. A lithographic apparatus according to claim 2, wherein the first and second relative positions correspond to 10% and 90% of the maximum relative intensity of the radiation beam.

4. A lithographic apparatus according to claim 1, comprising a device configured to change a position of the radiation beam.

5. A lithographic apparatus according to claim 4, wherein the device comprises a tiltable mirror and the processor is configured to calculate the relative movement of the radiation beam as a function of a tilt angle of the mirror and as a function of a beam delivery length between the mirror and the aperture.

6. A lithographic apparatus according to claim 5, wherein the processor is configured to receive a third relative intensity at a third relative position of the radiation beam at which the radiation beam at least partially overlaps the aperture on a first side of the aperture and to receive a fourth relative intensity at a fourth relative position of the radiation beam at which the radiation beam at least partially overlaps the aperture on a second side of the aperture opposite the first side, the processor further configured to calculate the beam delivery length as a function of tilt angles corresponding to the third and fourth relative positions of the radiation beam and a distance between the opposite sides of the aperture.

7. A lithographic apparatus according to claim 5, wherein the mirror is tiltable in two different directions.

8. A lithographic apparatus according to claim 5, wherein the mirror is a steering mirror located at a relatively large distance from the aperture.

9. A lithographic apparatus according to claim 1, wherein the aperture is formed by edges of a frame of a diffractive optical element.

10. A lithographic apparatus according to claim 1, comprising an optical element configured to vary the beam size of the radiation beam, the optical element being coupled to the processor.

11. A lithographic apparatus according to claim 1, comprising:
    a focusing element configured to focus a part of the radiation beam in a focus plane;
    an aperture arranged in the focus plane of the focusing element;
    a detector configured to detect an intensity of the part of the radiation beam through the aperture; and
    a processor configured to vary the intensity of the radiation beam through the aperture by a change in a pointing direction of the radiation beam and to calculate a beam divergence of the radiation beam from the detected intensity and pointing direction.

12. A lithographic apparatus according to claim 11, comprising:
    a first device configured to change a position of the radiation beam to effect the relative movement of the radiation beam and the aperture; and
    a second device configured to change the pointing direction of the radiation beam, the second device being provided after the first device in an optical path of the radiation beam.

13. A lithographic apparatus comprising:
    an illuminator configured to provide a beam of radiation;
    a support structure configured to hold a patterning device, the patterning device configured to pattern the beam according to a desired pattern;
    a substrate table configured to hold a substrate;
    a projection system configured to project the patterned beam onto a target portion of the substrate;
    a focusing element configured to focus a part of the radiation beam in a focus plane;
    an aperture arranged in the focus plane of the focusing element;
    a detector configured to detect an intensity of the part of the radiation beam propagating through the aperture; and
    a processor configured to vary the intensity of the radiation beam through the aperture by a change in a pointing direction of the radiation beam and to calculate a beam divergence of the radiation beam from the detected intensity and pointing direction.

14. A lithographic apparatus according to claim 13, comprising a device configured to change the pointing direction of the radiation beam.

15. A lithographic apparatus according to claim 14, wherein the device comprises a mirror tiltable in two different directions and configured to change the pointing direction of the radiation beam by tilting the mirror.

16. A lithographic apparatus according to claim 13, wherein the detector comprises one of an energy sensor and a positional detector.

17. A lithographic apparatus according to claim 13, comprising:

an aperture;

a detector configured to detect an intensity of at least part of the radiation beam directed through the aperture; and a processor configured to vary the intensity of the radiation beam through the aperture by a relative movement of the radiation beam and the aperture and to calculate a beam size of the radiation beam from the detected intensity and relative movement.

18. A lithographic apparatus according to claim 17, comprising:

a first device configured to change a position of the radiation beam to effect the relative movement of the radiation beam and the aperture; and a second device configured to change the pointing direction of the radiation beam, the second device being provided after the first device in an optical path of the radiation beam.

19. A method of determining a beam size of a radiation beam in a lithographic apparatus, the method comprising:

changing a position of the radiation beam relative to an aperture through which the radiation beam propagates;

detecting the intensity of at least part of the radiation beam propagating through the aperture relative to a maximum intensity as a function of relative movement of the radiation beam; and calculating the beam size of the radiation beam from the detected intensity as a function of the relative movement.

20. The method according to claim 19, wherein calculating the beam size comprises:

detecting a first relative intensity at a first relative position of the radiation beam;

detecting a second relative intensity at a second relative position of the radiation beam; and calculating the beam size as a ratio of differences of first and second relative positions and first and second relative intensities.

21. The method according to claim 20, wherein the first and second relative positions correspond to 10% and 90% of the maximum relative intensity of the radiation beam.

22. The method according to claim 19, further comprising:

reflecting the radiation beam from a mirror;

changing a position of the radiation beam at the aperture by tilting the mirror; and calculating the relative movement of the radiation beam as a function of a tilt angle of the mirror and as a function of a beam delivery length between the mirror and the aperture.

23. The method according to claim 22, wherein the mirror is configured to tilt in two different directions and the beam size is measured in the two different directions.

24. The method according to claim 22, wherein the mirror is a steering mirror located at a relatively large distance from the aperture.

25. The method according to claim 22, further comprising:

detecting a third relative intensity at a third relative position of the radiation beam at which the radiation beam at least partially overlaps the aperture on a first side;

detecting a fourth relative intensity at a fourth relative position of the radiation at which the radiation beam at least partially overlaps the aperture on a second side opposite the first side; and calculating the beam delivery length from tilt angles corresponding to the third and fourth relative positions and from a distance between the opposite sides of the aperture.

26. The method according to claim 25, wherein the third and fourth relative positions of the radiation beam correspond to 50% of the maximum relative intensity through the aperture.

27. The method according to claim 19, comprising varying the beam size of the radiation beam so as to tune the radiation beam to a desired beam size.

28. A method of determining a beam divergence of a radiation beam in a lithographic apparatus, the method comprising:

focusing a part of the radiation beam in a focus plane, an aperture being provided in the focus plane;

changing a pointing direction of the radiation beam;

detecting the intensity of the part of the radiation beam propagating through the aperture relative to a maximum intensity as a function of the pointing direction of the radiation beam; and calculating the beam divergence of the radiation beam from the detected intensity as a function of the pointing direction.

29. The method according to claim 28, wherein calculating the beam divergence comprises:

determining a first relative intensity at a first pointing direction of the radiation beam;

determining a second relative intensity at a second pointing direction of the radiation beam; and calculating the beam divergence as a ratio of differences of first and second pointing directions and first and second relative intensities.

30. The method according to claim 28, wherein the intensity is detected using one of an energy sensor and a positional detector.

31. The method according to claim 28, wherein the pointing direction of the radiation beam is changed by reflecting the radiation beam on a mirror and tilting the mirror in two different directions so as to change the pointing direction of the radiation beam.

* * * * *